US010756158B2

(12) United States Patent
Tomitani

(10) Patent No.: US 10,756,158 B2
(45) Date of Patent: Aug. 25, 2020

(54) DISPLAY DEVICE

(71) Applicant: Japan Display Inc., Tokyo (JP)

(72) Inventor: Hisashi Tomitani, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 16/237,037

(22) Filed: Dec. 31, 2018

(65) Prior Publication Data

US 2019/0221632 A1  Jul. 18, 2019

(30) Foreign Application Priority Data

Jan. 15, 2018 (JP) .................. 2018-004505

(51) Int. Cl.
| | |
|---|---|
| H05K 1/00 | (2006.01) |
| H01L 27/32 | (2006.01) |
| H01L 51/52 | (2006.01) |
| G09G 3/3258 | (2016.01) |
| H01L 51/00 | (2006.01) |
| G09G 3/3225 | (2016.01) |

(52) U.S. Cl.
CPC ....... *H01L 27/3276* (2013.01); *G09G 3/3225* (2013.01); *G09G 3/3258* (2013.01); *H01L 27/3251* (2013.01); *H01L 51/0097* (2013.01); *H01L 51/5253* (2013.01); *G09G 2300/0426* (2013.01); *G09G 2330/08* (2013.01); *H01L 2251/5338* (2013.01)

(58) Field of Classification Search
CPC ....... G09G 2300/0426; G09G 2330/08; G09G 3/3225; G09G 3/3258; H01L 2251/5338; H01L 27/3251; H01L 27/3276; H01L 51/0097; H01L 51/5253
See application file for complete search history.

(56) References Cited

U.S. PATENT DOCUMENTS

| | | | |
|---|---|---|---|
| 2014/0049449 A1* | 2/2014 | Park | G09G 5/00 345/1.3 |
| 2014/0056028 A1* | 2/2014 | Nichol | G02B 6/0065 362/611 |
| 2014/0232956 A1* | 8/2014 | Kwon | G02F 1/133305 349/12 |
| 2015/0179728 A1* | 6/2015 | Kwon | H01L 51/0097 257/40 |
| 2016/0240602 A1* | 8/2016 | Ki | H01L 29/78672 |
| 2017/0170206 A1 | 6/2017 | Lee et al. | |
| 2018/0076412 A1* | 3/2018 | Kim | H04M 1/0266 |
| 2018/0097044 A1* | 4/2018 | Choi | H01L 27/3223 |
| 2019/0157312 A1* | 5/2019 | Lee | H01L 51/52 |

FOREIGN PATENT DOCUMENTS

JP   2017-111435 A   6/2017

* cited by examiner

*Primary Examiner* — Yuriy Semenenko
(74) *Attorney, Agent, or Firm* — Michael Best & Friedrich LLP

(57) ABSTRACT

According to one embodiment, a display device includes a substrate, a display element provided on the substrate, a driver provided on the substrate configured to drive the display element and a first wire electrically connected to the display element. The first wire includes a first bent portion projecting in a first direction and provided in a first location, and a second bent portion projecting in a direction opposite to the first direction and provided in a second location different from the first location in the first direction and a second direction crossing the first direction.

5 Claims, 13 Drawing Sheets

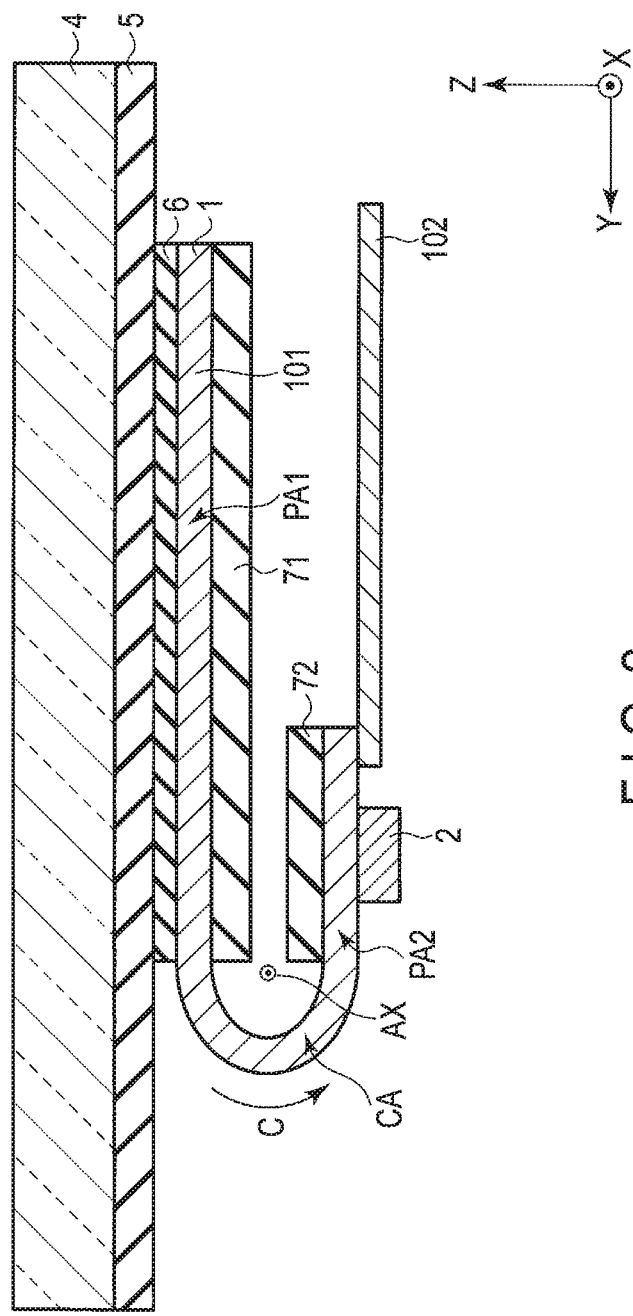
F I G. 2

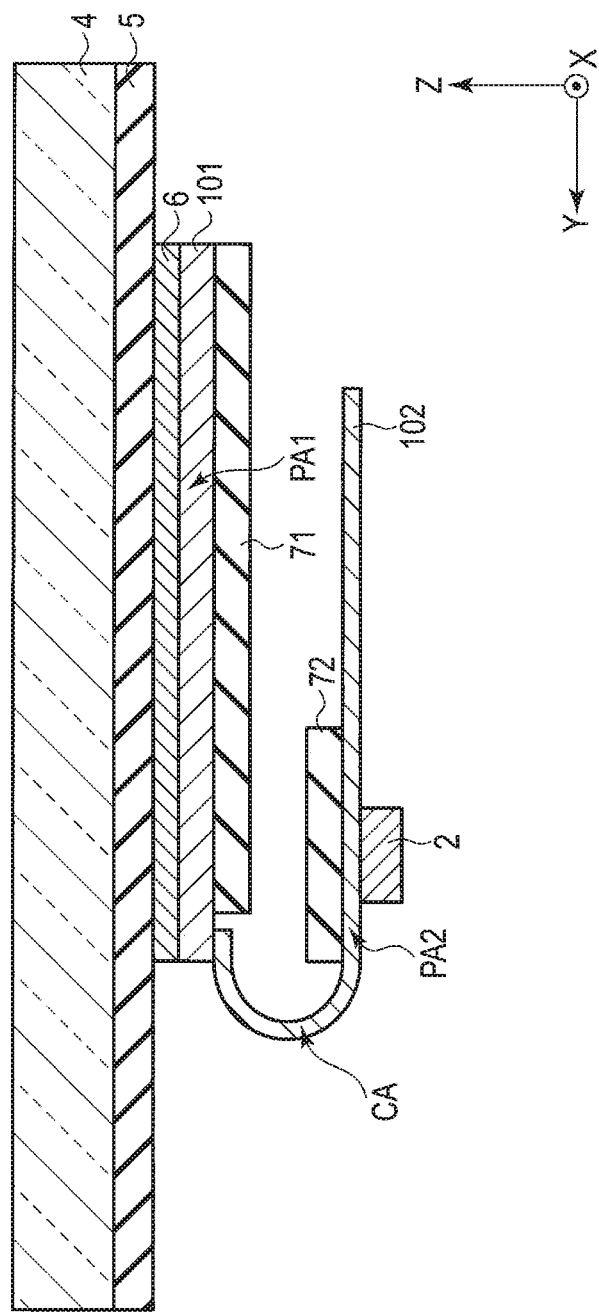
F I G. 3

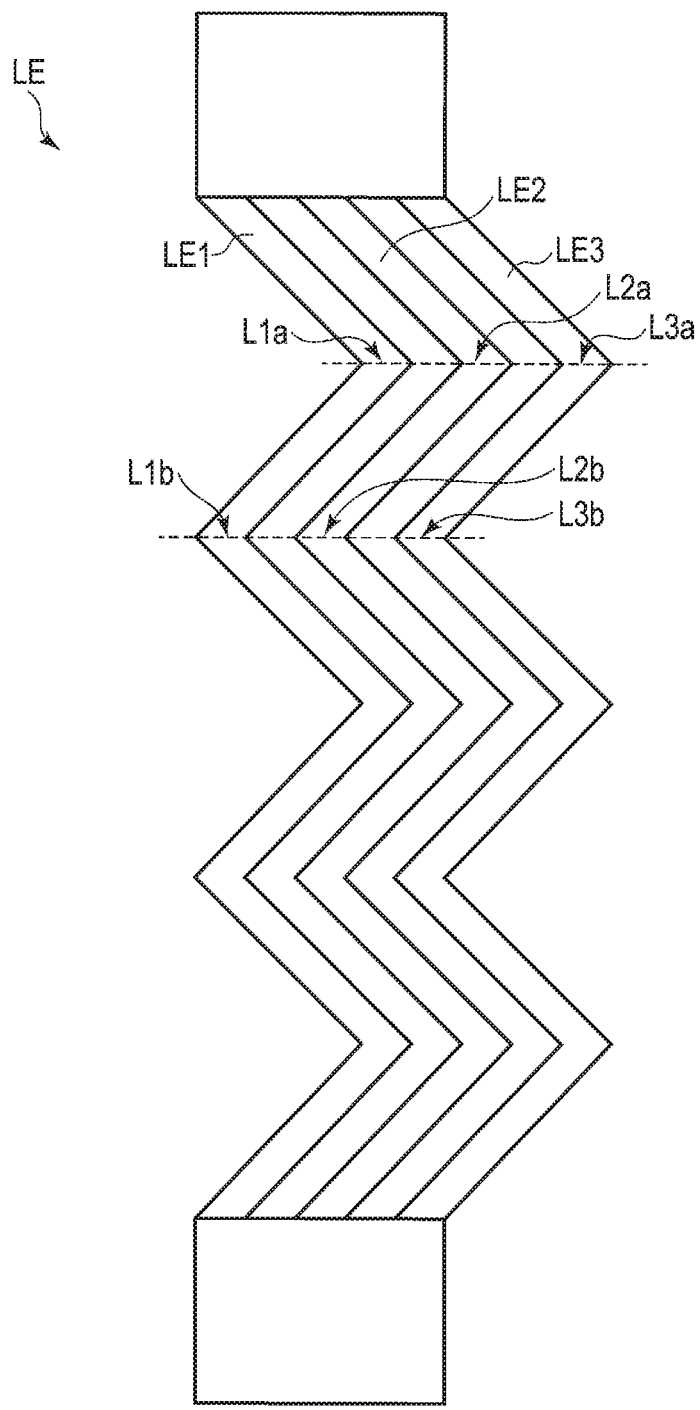
F I G. 10

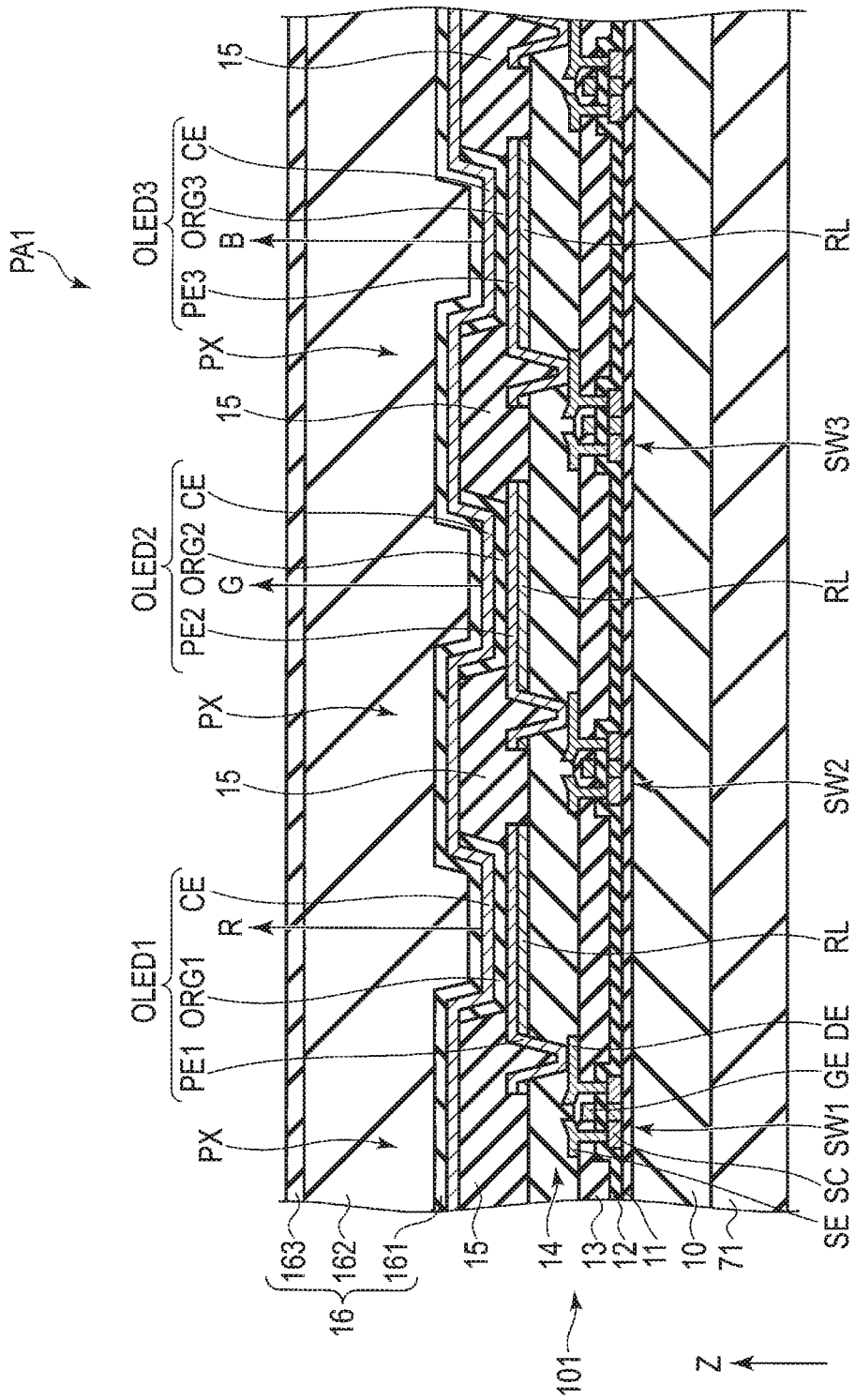
F I G. 12

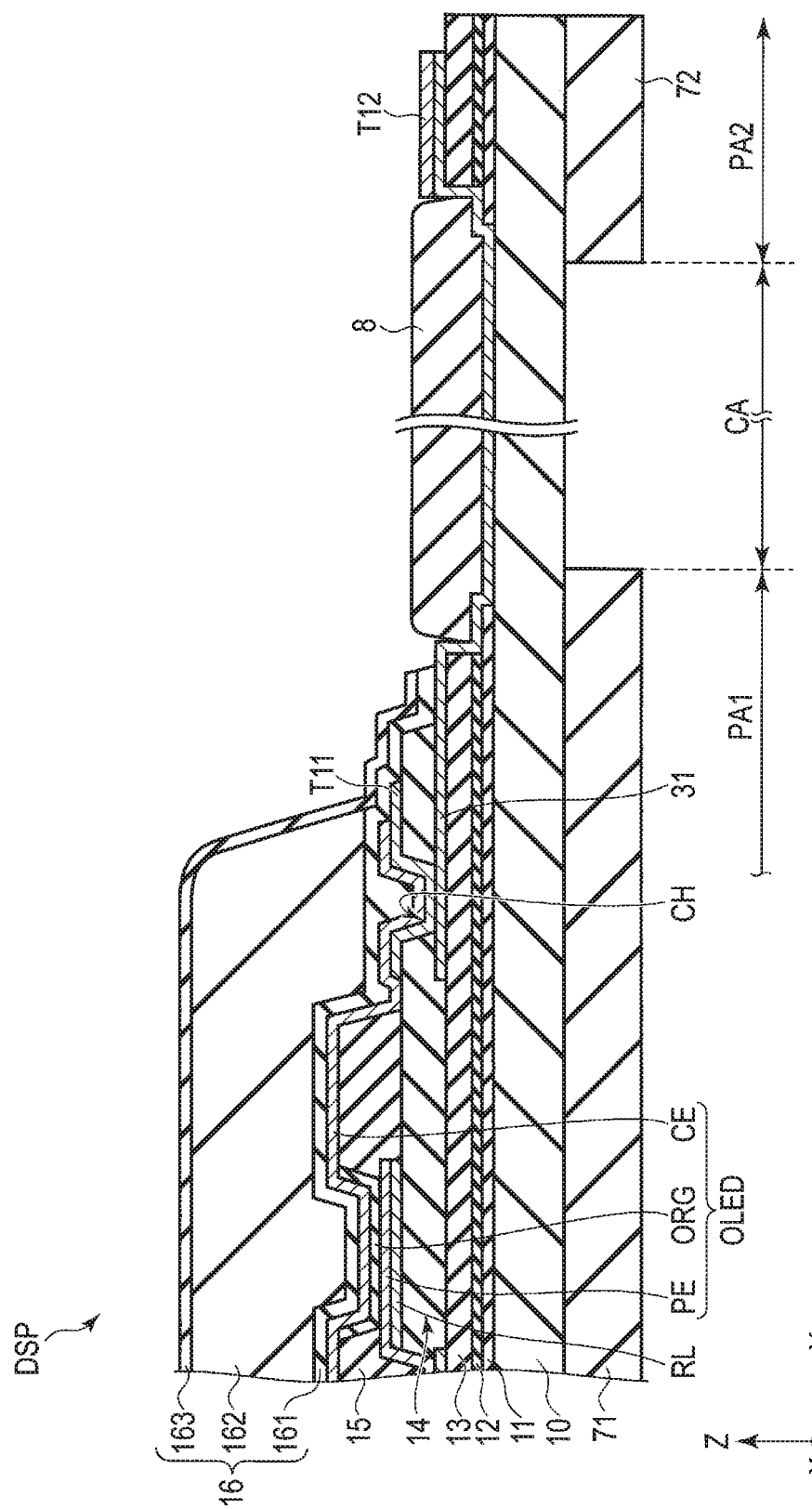
F I G. 13

DISPLAY DEVICE

CROSS-REFERENCE TO RELATED APPLICATIONS

This application is based upon and claims the benefit of priority from Japanese Patent Application No. 2018-004505, filed Jan. 15, 2018, the entire contents of which are incorporated herein by reference.

FIELD

Embodiments described herein relate generally to a display device.

BACKGROUND

In the technical field of display devices used in, for example, mobile phones and personal digital assistants (PDA), there is a demand of narrowing of the frame for higher performance and advanced design. As an example of the narrowing of the frame, a method is known that a part of the display panel is bent to locate a driver and the like below the display surface. However, wires provided in the bent region are broken in some cases as affected due to the stress caused by bending. Further, when a wire is broken, the resistance of the wires in total increases, which may cause deterioration of signals supplied to the wires.

BRIEF DESCRIPTION OF THE DRAWINGS

FIG. 2 is a cross section showing a configuration example of the display device DSP shown in FIG. 1.

FIG. 3 is a cross section showing another configuration example of the display device DSP shown in FIG. 1.

FIG. 10 is a diagram showing a wire of a comparative example.

FIG. 12 is a diagram showing a cross section of a plane area PA1 of the display device DSP of FIG. 1.

FIG. 13 is diagram showing a cross section of each of a plane area PA1, a curved surface area CA and a plane area PA2.

DETAILED DESCRIPTION

Figure 1:
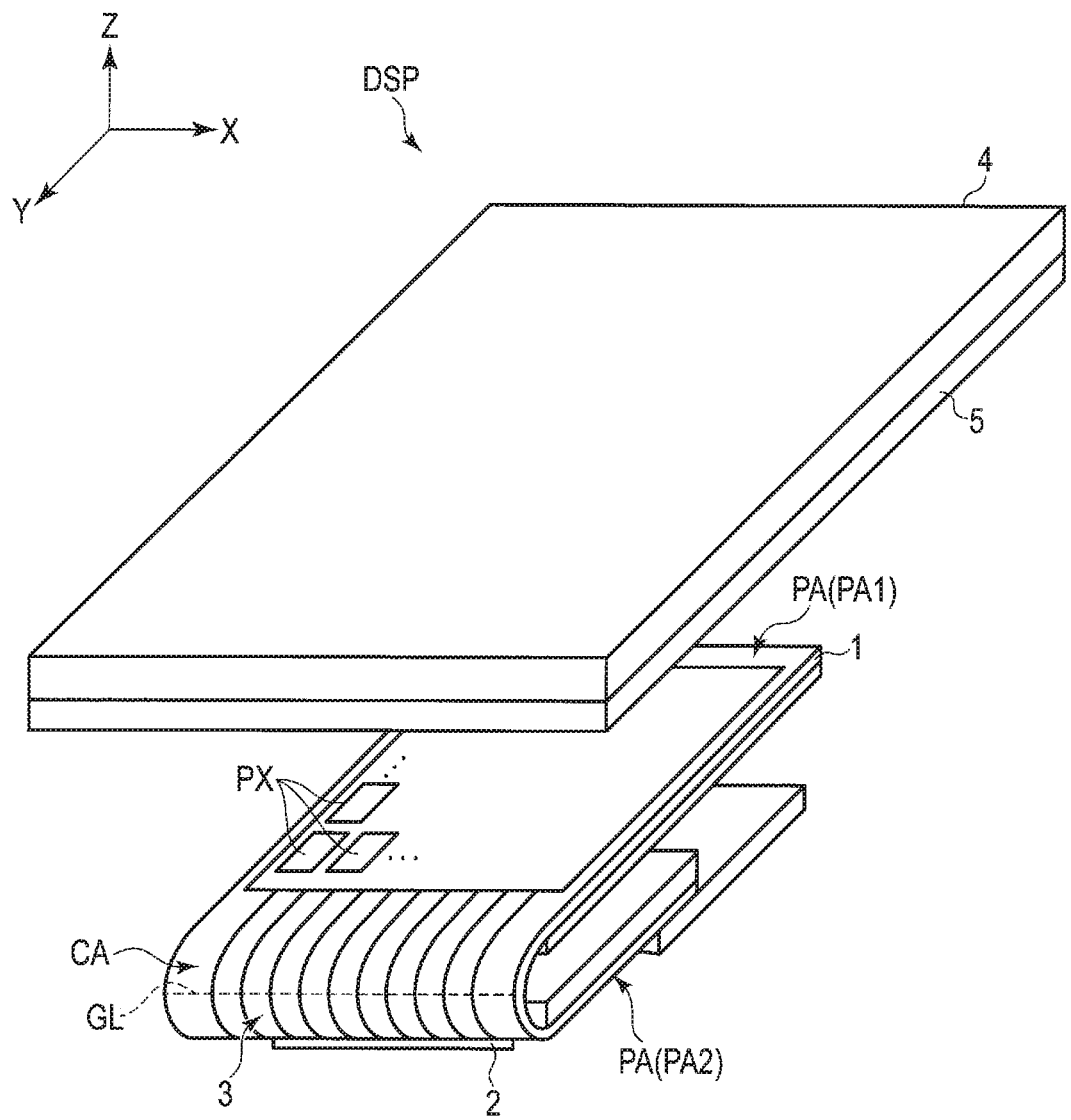
FIG. 1 is a perspective view schematically showing a display device DSP of a first embodiment.

In general, according to one embodiment, a display device comprises a substrate, a display element provided on the substrate, a driver provided on the substrate configured to drive the display element and a first wire electrically connected to the display element, and the first wire comprises a first bent portion projecting in a first direction and provided in first location, and a second bent portion projecting in a direction opposite to the first direction and provided in a second location different from the first location in the first direction and a second direction crossing the first direction.

According to another embodiment, a display device comprises a substrate, a display element provided on the substrate, a driver provided on the substrate configured to drive the display element, and a plurality of wires each electrically connecting the display element to the driver. The wires comprise a second wire comprising a fourth bent portion provided in a sixth location. The third wire is adjacent to the second wire in a first direction and comprises a fifth bent portion provided in a seventh location different from the sixth location in a second direction crossing the first direction.

The embodiments will be described hereinafter with reference to the accompanying drawings. Note that the disclosure is presented for the sake of exemplification, and any modification and variation conceived within the scope and spirit of the invention by a person having ordinary skill in the art are naturally encompassed in the scope of invention of the present application. In addition, in some cases, in order to make the description clearer, the widths, thicknesses, shapes, etc., of the respective parts are schematically illustrated in the drawings and compared to the actual modes. However, the schematic illustration is merely an example, and adds no restrictions to the interpretation of the invention. In addition, in the specification and drawings, the structural elements, which have functions identical or similar to the functions described in connection with preceding drawings, are denoted by like reference numbers, and an overlapping detailed description thereof may be omitted unless otherwise necessary.

First Embodiment

FIG. 1 is a perspective view schematically showing a display device DSP of the first embodiment. FIG. 1 illustrates a partially decomposed display device DSP.

A direction X (first direction) and a direction Y (second direction) are directions intersecting each other, and a direction Z is a direction intersecting the direction X and the direction Y. For example, the direction X, the direction Y and the direction Z are orthogonal to each other, but they may cross each other at an angle other than 90 degrees. In this specification, a direction indicated by the tip of the arrow along the direction Z is referred to as upward (or simply, above), and a direction opposite to that indicated by the tip of the arrow is referred to as downward (or simply, under). Further, when it is assumed that an observation position at which the display device DSP is to be observed is located at the pointing end side of the arrow indicating the direction Z, a view toward an X-Y plane defined by the direction X and the direction Y is referred to as a plan view.

In this embodiment, the display device DSP is, for example, an electroluminescence display which has an electroluminescence (EL) element. The EL element includes an organic EL element and an inorganic EL element. However, the display device DSP may be some other display device such as a liquid crystal display comprising a liquid crystal layer or an electronic paper type display device comprising an electrophoretic element.

The display device DSP comprises a substrate 1, a driver 2, a wiring portion 3, a cover member 4 and a polarizer 5.

The substrate 1 is flexible and partially bent. The substrate 1 comprises, for example, a plane area PA and a curved surface area CA. The plane area PA includes a plane area PA1 and a plane area PA2, which oppose each other. The curved surface area CA is an area of the substrate 1, which has curvature and is located between the plane area PA1 and the plane area PA2. In the FIG. 1, the curved surface area CA has a bus-bar GL along the direction X.

A plurality of pixels PX are arranged on the substrate 1. A plurality of pixels PX are arranged in a first area (for example, the plane area PA1) of the substrate 1. Each of the pixels PX contains an organic EL element as a display element, a switching element connected to the organic EL element and the like.

The driver 2 is mounted on the substrate 1. The driver 2 is disposed in a third area (for example, the plane area PA2) of the substrate 1. The driver 2 supplies various signals for driving the pixels PX.

The wiring portion 3 is disposed on the substrate 1. The wiring portion 3 is located at least in the second area (for example, the curved surface area CA). The second area is located between the first area and a third area. The wiring portion 3 includes a plurality of wires electrically connected to the pixels PX, respectively. That is, the wiring portion 3 comprises wires which electrically connect pixels PX to the driver 2, wires which supply a power source potential to the pixels PX, and the like.

The cover member 4 is formed of a transparent material such as a resin or glass. The cover member 4 covers the entire plane area PA. The polarizer 5 has substantially the same size as that of the cover member 4, and is located directly under the cover member 4. The polarizer 5 suppresses the reflection light, for example, by the metal wires disposed in the plane area PA from being visually recognized. Note that the polarizer 5 may be omitted.

FIG. 2 is a cross-sectional view showing a configuration example of the display panel PNL shown in FIG. 1. FIG. 2 shows a plane parallel to the Y-Z plane defined by the direction Y and the direction Z. In the FIG. 2, the substrate 1 and the polarizer 5 are adhered together by an adhesive 6.

The display device DSP comprises support members 71 and 72 in addition to the substrate 1, the driver 2, the wiring portion 3, the cover member 4 and the polarizer 5.

The substrate 1 includes a sub-substrate (first sub-substrate) 101 and another sub-substrate (second sub-substrate) 102. The sub-substrate 101 is located above the sub-substrate 102 and is in contact with the adhesive 6. In the FIG. 2, the sub-substrate 101 comprises both the plane area PA1 and the curved surface area CA. The sub-substrate 101 and the sub-substrate 102 both comprise the plane area PA2. The sub-substrate 102 is located under the plane area PA1 of the sub-substrate 101. The sub-substrate 102 is, for example, a flexible printed circuit board (FPC). The sub-substrate 102 is connected to one end portion of the sub-substrate 101. The sub-substrate 102 is electrically connected to the sub-substrate 101 via, for example, an anisotropic conducting film.

The support member 71 and the support member 72 are attached onto the sub-substrate 101, to form the plane area PA1 and the plane area PA2, respectively. The support member 71 and the support member 72 oppose each other.

The driver 2 is located in the plane area PA2. In the FIG. 2, the driver 2 is provided on a surface on an opposite side to the surface of the sub-substrate 101 on a cover member 4 side.

In this embodiment, the curved surface area CA is formed by bending the sub-substrate 101 around a bend axis AX. Here, the bend axis AX is parallel to the direction X. Moreover, as indicated by a curved arrow in the figure, a direction towards the plane area PA2 from the plane area PA1 along the curved surface area CA is defined as a circumferential direction C.

FIG. 3 is a cross-sectional view showing another configuration example of the display panel PNL shown in FIG. 1. The example shown in FIG. 3 is different from that of FIG. 2 in that the sub-substrate 102 comprises a curved surface area CA.

The support member 71 is attached onto the sub-substrate 101, to form a plane area PA1. The support member 72 is attached onto the sub-substrate 102, to form a plane area PA2. The driver 2 is mounted on the sub-substrate 102. In the FIG. 3, the sub-substrate 102 is connected to a lower surface of the sub-substrate 101, i.e., the surface on of the sub-substrate 101 an opposite side to the surface on the cover member 4 side, in one end portion of the sub-substrate 101. Note that the sub-substrate 102 may be connected to the upper surface of the sub-substrate 101.

Figure 4:
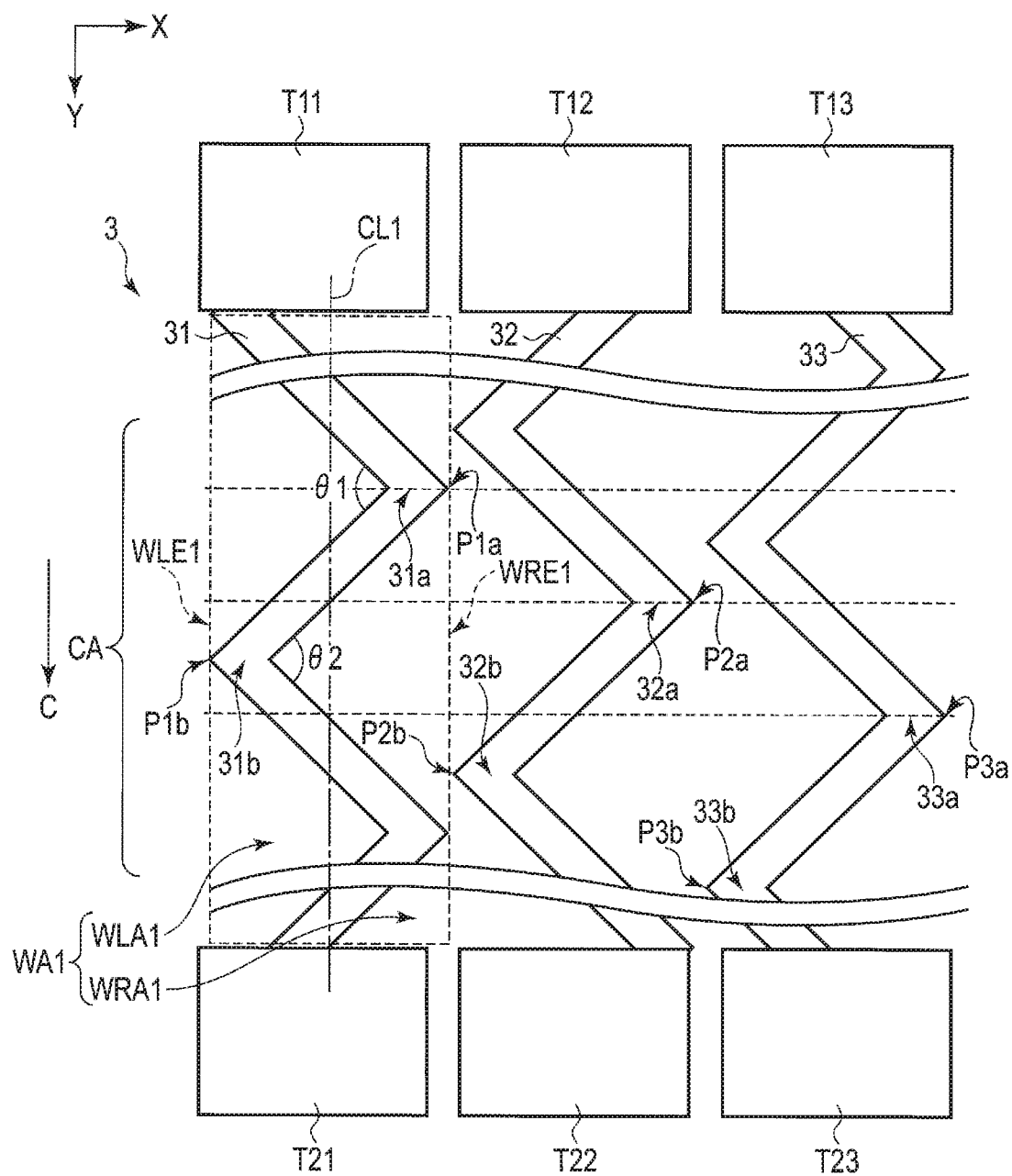
FIG. 4 is a diagram showing a part of a wiring portion 3 shown in FIG. 1.

FIG. 4 is a diagram showing a part of the wiring portion 3 shown in FIG. 1. FIG. 4 shows wires 31, 32 and 33 included in the wiring portion 3. Here, a plane parallel to the X-Y plane is shown formally. In the curved surface area CA, the direction Y is equivalent to the circumferential direction C described above.

The wires 31, 32 and 33 are arranged in this order along the direction X, and each extend along the direction Y. In other words, the wires 31, 32 and 33 are in the curved surface area CA, and extend in the circumferential direction C. In the FIG. 4, in one end of each of the wires 31, 32 and 33, terminals T11, T12 and T13 are provided, respectively. In the other end of each of the wires 31, 32 and 33, terminals T21, T22 and T23 are provided, respectively. The terminals T11, T12 and T13 are connected to the scanning lines, signal lines, common electrodes, power source potential supply wires (anode power source wires and cathode power source wires) and the like, for driving the pixels PX. The terminals T21, T22 and T23 are connected to, for example, the driver 2 described above. Different signals are, respectively, supplied to the wires 31, 32 and 33. Note that the same signal may be supplied to the wires 31, 32 and 33.

Here, an area where the wire 31 is defined as a wire area WA1. In the example shown in FIG. 4, the wire area WA1 is formed into a rectangle. The wire area WA1 is divided into a first wire area WLA1 and a second wire area WRA1 by a center line CL1 extending along the extending direction (direction Y) of the wire 31. Moreover, if one end portion of the wire area WA1 along a direction intersecting the extending direction of the wire 31 is defined as a first wiring end portion WLE1 and another end portion is defined as a second wiring end portion WRE1, a direction towards the center line CL1 from the first wiring end portion WLE1 is the direction X (forward direction of the direction X), and a direction towards the center line CL1 from the second wiring end portion WRE1 is an opposite direction to the direction X.

The wire 31 is formed zigzag. That is, the wire 31 comprises a plurality of bent portions 31a and a plurality of bent portions 31b. The bent portions (fourth bent portions) 31a project to the direction X (its forward direction). On the other hand, the bent portions 31b project to an opposite direction to the direction X. The bent portions 31a each have a first angle $\theta 1$ and the bent portions 31b each have a second angle $\theta 2$. In the FIG. 4, the first angle $\theta 1$ and the second angle $\theta 2$ each are about 90 degrees, but it is sufficient if they are at least less than 180 degrees. Moreover, the first angle $\theta 1$ and the second angle $\theta 2$ may be different from each other. Furthermore, the bent portions 31a may not necessarily have the constant first angle θ1, but may have several different angles. Similarly, the bent portions 31b may not necessarily have the constant second angle θ2, but may have several different angles. Note that the bent portions 31a and the bent portions 31b are arranged alternately along the direction Y.

The wires 32 and 33 have a structure similar to that of the wire 31. That is, the wire 32 includes a bent portion (fifth bent portion) 32a projecting in the direction X and a bent portion 32b projecting in a direction opposite to the direction X. The wire 33 includes a bent portion 33a projecting in the direction X and a bent portion 33b projecting in a direction opposite to the direction X.

In this embodiment, at least wires adjacent to each other are arranged so that the positions of the bent portions do not coincide with each other. In the FIG. 4, with respect to the direction Y, the location (sixth location) of the bent portion 31a, the location (seventh location) of the bent portion 32a and the location of the bent portion 33a differ from each other. In other words, the bent portions 31a, 32a and 33a are not arranged in line along the direction X. Here, the location of the bent portion 31a is equivalent to the location of an apex (third apex) P1a of the bent portion 31a. The location of the bent portion 32a is equivalent to the position of an apex (fourth apex) P2a of the bent portion 32a. The location of the bent portion 33a is equivalent to the location of an apex P3a of the bent portion 33a.

Similarly, the locations of the bent portions 31b, 32b and 33b on the direction Y differ from each other. In other words, the bent portions 31b, 32b and 33b are not arranged in line along the direction X. Here, the location of the bent portion 31b is equivalent to the location of an apex P1b of the bent portion 31b. The location of the bent portion 32b is equivalent to the location of an apex P2b of the bent portion 32b. The location of the bent portion 33b is equivalent to the location of an apex P3b of the bent portion 33b.

Further, in the FIG. 4, the location of the bent portion 31a on the direction Y differs also from the locations of the bent portions 32b and 33b on the direction Y. Similarly, the location of the bent portion 32a on the direction Y differs also from the locations of the bent portions 31b and 33b on the direction Y. The location of the bent portion 33a on the direction Y differs also from the locations of the bent portions 31b and 32b on the direction Y.

According to this embodiment, the locations of the bent portions on the direction Y are shifted between the wires 31, 32 and 33, and thus the stress created as the sub-substrate 101 being bent can be dispersed.

Here, the reason thereof will be described with reference to FIG. 10. FIG. 10 shows a wire LE as a comparative example. The wire LE comprises wire portions LE1, LE2 and LE3. The wire portions LE1, LE2 and LE3 comprise, respectively, bent portions L1a, L2a and L3a projecting in the direction X and also, respectively, bent portions L1b, L2b and L3b projecting in a direction opposite to the direction X. For example, when the locations of the bent portion L1a, L2a and L3a of the wire portions LE1, LE2 and LE3 on the direction Y are aligned with each other as shown in FIG. 10, the stress tends to concentrate on a straight line indicated by a dashed line, connecting the apexes of the bent portion L1a, L2a and L3a. Moreover, when the locations of the bent portion L1b, L2b and L3b on the direction Y are aligned with each other, the stress tends to concentrate on a straight line indicated by a dashed line, connecting the apexes of the bent portion L1b, L2b and L3b.

In this embodiment, the locations of bent portions on the direction Y are shifted with respect to each other, and thus it is possible to inhibit concentrating of stress in a predetermined region of the substrate 1 as a whole, and thus the curvature in the curved surface area CA can be made uniform. In this manner, breaking of the wires 31, 32 and 33 can be suppressed, and a display device with an improved reliability can be provided.

Second Embodiment

Figure 5:
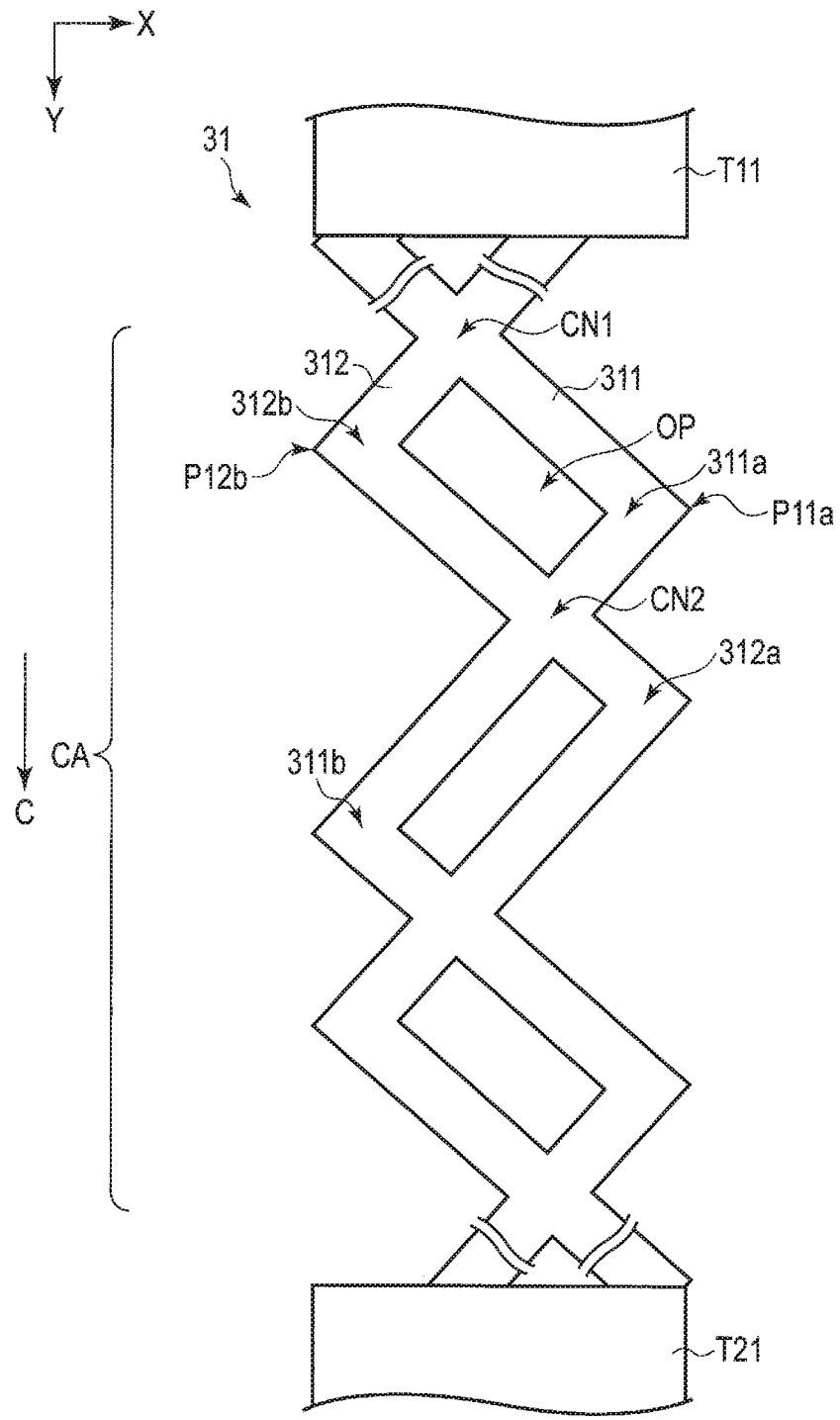
FIG. 5 is a diagram showing a wire 31 of a display device DSP according to a second embodiment.

FIG. 5 is a diagram showing a willing line 31 of a display device DSP according to the second embodiment. The second embodiment is different from the first embodiment in that the wire 31 comprises a plurality of wire portions (partial regions). In FIG. 5, the wire 31 includes a wire portion (first line portion) 311 and a wire portion (second line portion) 312 as partial regions.

The wire portion 311 and the wire portion 312 have a structure similar to that of the wire 31 shown in FIG. 4. That is, the wire portion 311 comprises bent portions (first bent portion) 311a projecting in the direction X and bent portions 311b projecting in a direction opposite to the direction X. The bent portions 311a and 311b are arranged alternately along the direction Y. In other words, the bent portions 311a and 311b are extend along a circumferential direction C, and are arranged in a curved surface area CA. The wire portion 312 comprises bent portions 312a projecting in the direction X and bent portions (second bent portion) 312b projecting in a direction opposite to the direction X. The bent portion 312a and the bent portion 312b are arranged alternately in line along the direction Y. In other words, the bent portions 312a and 312b are extend in the circumferential direction C, and are arranged in the curved surface area CA. In the FIG. 5, the bent portions 311a and the bent portions 312b respectively project toward opposite directions. Moreover, the bent portions 311b and the bent portions 312a respectively project toward opposite directions.

In this embodiment, the locations of the bent portions included in the wire 31 are different from the positions of at least the bent portions projecting in the opposite directions of those bent portions adjacent to each other in both the direction X and the direction Y. For example, the locations (first locations) of the bent portion 311a and the locations (second locations) of the bent portions 312b are respectively different from each other in both the direction X and the direction Y. In other words, the bent portions 311a and the bent portions 312b are not arranged along the direction Y. Moreover, the bent portions 311a and the bent portions 312b are not arranged along the direction X. Here, the locations of the bent portions 311a are respectively equivalent to the locations of the apexes (first apexes) P11a of the bent portions 311a. The locations of the bent portions 312b are respectively equivalent to the locations of the apexes (second apexes) P12b of the bent portions 312b.

The wire portion 311 and the wire portion 312 are connected to each other in a connection portion CN (CN1, CN2) (by intersecting). Thus, the wire portion 311 and the wire portion 312 are at the same potential. That is, identical signals are supplied respectively to the wire portion 311 and the wire portion 312. For example, a power source potential is supplied to the wire 31. The wire portions (wire portions 311 and 312) may be formed respectively in layers different from each other and connected via the connection portion CN, but the wire portions and the connection portion CN may be all formed by in the same layer.

The locations (third locations) of connection portions (first connection portions) CN1 and the locations (fourth locations) of connection portions (second connection portions) CN2 are respectively different from each other along both the direction X and the direction Y. In other word, the connection portions CN1 and the connection portions CN2 are not arranged along the direction Y. Further, the connection portions CN1 and the connection portions CN2 are not arranged along the direction X. Each respective pair of a bent portion 311a and a bent portion 312b are located between a respective pair of a connection portion CN1 and a connection portion CN2, so as to be apart from each other. That is, the wire 31 comprises openings OP each defined by an inner circumference of a respective bent portion 311a, a respective bent portion 312b, a respective connection portion CN1 and a respective connection portion CN2.

Figure 6:
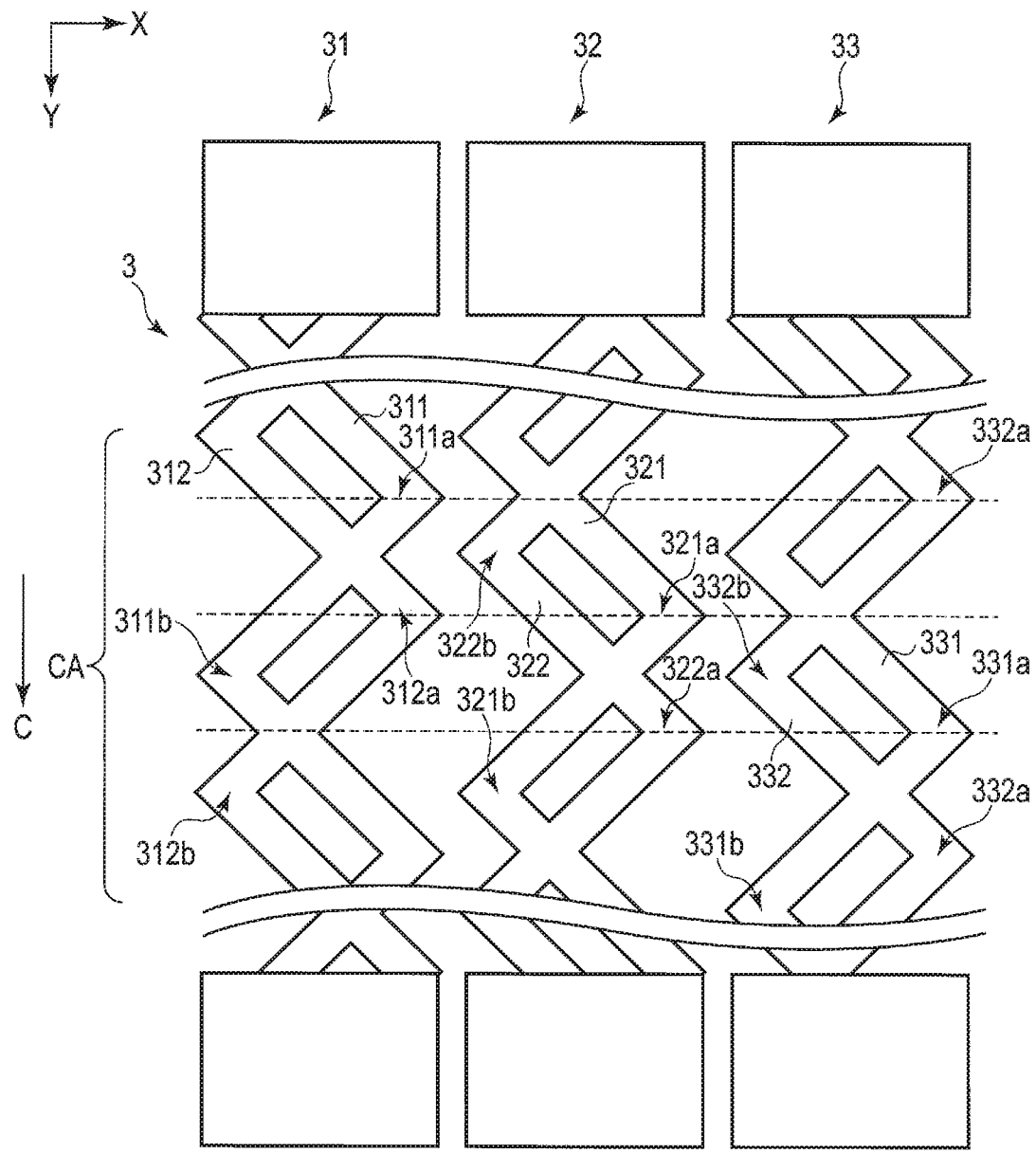
FIG. 6 is a diagram showing a wiring portion 3 of the display device DSP of the second embodiment.

FIG. 6 is a diagram showing a wiring portion 3 of the display device DSP according to the second embodiment. FIG. 6 shows wires 31, 32 and 33 adjacent to each other.

The wires 32 and 33 have a structure similar to that of the wire 31 shown in FIG. 5. That is, the wire 32 includes a wire portion 321 and a wire portion 322. The wire portion 321 comprises bent portions 321a projecting in the direction X and bent portions 321b projecting in a direction opposite to the direction X. The wire portion 322 comprises bent portions 322a projecting in the direction X and bent portions 322b projecting in a direction opposite to the direction X. In the FIG. 6, the arrangement of the wire portion 321 is equivalent to the arrangement of the wire 32 shown in FIG. 4.

Similarly, the wire 33 includes a wire portion 331 and a wire portion 332. The wire portion 331 comprises bent portions 331a projecting in the direction X and bent portions 331b projecting in a direction opposite to the direction X. The wire portion 332 comprises bent portions 332a projecting in the direction X and bent portions 332b projecting in a direction opposite to the direction X. In the FIG. 6, the arrangement of the wire portion 331 is equivalent to the arrangement of the wire 33 shown in FIG. 4.

On the direction Y, the locations of the bent portions 311a are not coincident with the respective locations of the bent portions of the wire 32. In the FIG. 6, the locations of the bent portions 311a are not coincident with the respective locations of connection portion where the wire portions 321 and the respective wire portions 322 are connected to each other in the wire 32. On the other hand, the locations of the bent portions 311a are coincident with the locations of the bent portions 332a of the wire 33.

Moreover, on the direction Y, the locations of the bent portions 312a are coincident with the locations of the bent portions 321a of the wire 32. On the other hand, the locations of the bent portions 312a are not coincident with the locations of the respective bent portions of the wire 33. In the FIG. 6, the locations of the bent portions 312a are coincident with the locations of connection portions where the wire portions 331 and the respective wire portions 332 are connected each other in the wire 33.

According to this embodiment, the wire 31 includes the wire portion 311 comprising the bent portions 311a and the wire portions 312 comprising the bent portions 312b. The bent portions 311a and the bent portions 312b respectively oppose each other, and their locations along the direction Y differ from each other. With this structure, the stress which may be produced by the sub-substrate 101 being bent can be dispersed. Thus, it is possible to inhibit concentration of the stress on a certain region of the sub-substrate 101 as a whole, thereby making it possible to homogenize the curvature in the curved surface area CA. Consequently, breaking of the wire 31 can be suppressed and a display device with an improved reliability can be provided.

Further, according to this embodiment, the wire portion 311 and the wire portion 312 are connected to each other in the connection portions CN formed in a plurality of locations. With this structure, even if one of the wire portions 311 and 312 breaks, the current path can be secured by the connection portions CN. Thus, the operation of the display device DSP can be stabilized, thereby improving the reliability thereof.

Third Embodiment

Figure 7:
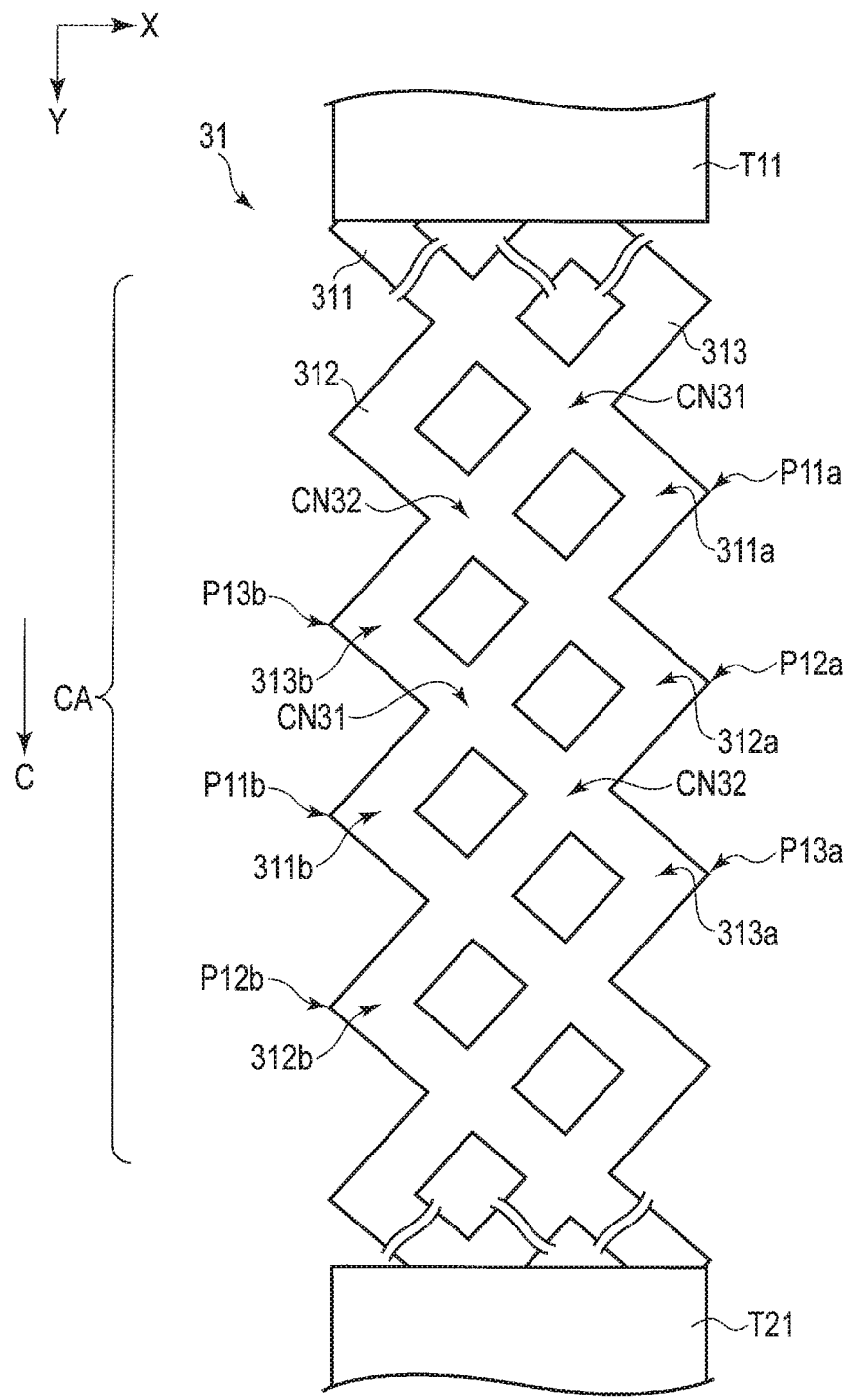
FIG. 7 is a diagram showing a wire 31 of a display device DSP according to a third embodiment.

FIG. 7 is a diagram showing a wire 31 of a display device DSP according to the third embodiment. The third embodiment is different from the second embodiment in that the wire 31 comprises a wire portion 313 in addition to the wire portions 311 and 312.

The wire portion (third wire portions) 313 has a structure similar to that of the wire portions 311 and 312. That is, the wire portions 313 comprises bent portions (third bent portions) 313a projecting in the direction X and bent portions 313b projecting in a direction opposite to the direction X. The bent portions 313a and 313b are arranged alternately along the direction Y. In other words, the bent portions 313a and 313b extend in a circumferential direction C, and are arranged in a curved surface area CA. Moreover, the wire portions 313 is connected with the wire portion 311 in connection portions CN31 and is connected also with the wire portion 312 in connection portions CN32. Thus, the wire portions 313 are at the same potential as that of the wire portions 311 and 312. For example, the power source potential is supplied to the wire 31. The wire portions 313 may be formed in a layer different from at least one of the layers where the wire portion 311 and the wire portion 312 and connected to each other via the connection portions CN31 or connection portions CN32, but they may as well be formed in the same layer.

On the direction Y, the locations (fifth locations) of the bent portions 313a and the locations of the bent portions 313b do not agree with the locations of the respective bent portions 311a and 311b of the wire portion 311, or those of the respective bent portions 312a and 312b of the wire portion 312. Here, the locations of the bent portions 313a are equivalent to the locations of respective apexes P13a of the bent portion 313a, and the locations of the bent portions 313b are equivalent to the locations of respective apexes P13b of the bent portions. The apex P13a is located between the apex P11b of the respective bent portion 311b and the apex P12b of the respective bent portion 312b along the direction Y. The apex P13b is located between the apex P11a of the respective bent portion 311a and the apex P12a of the respective bent portion 312a along the direction Y. Note that the wire portions 311, 312 and 313 of such a configuration can be regarded as that they are arranged along the direction Y to be shifted at a phase of 120 degrees from one to the next.

Figure 8:
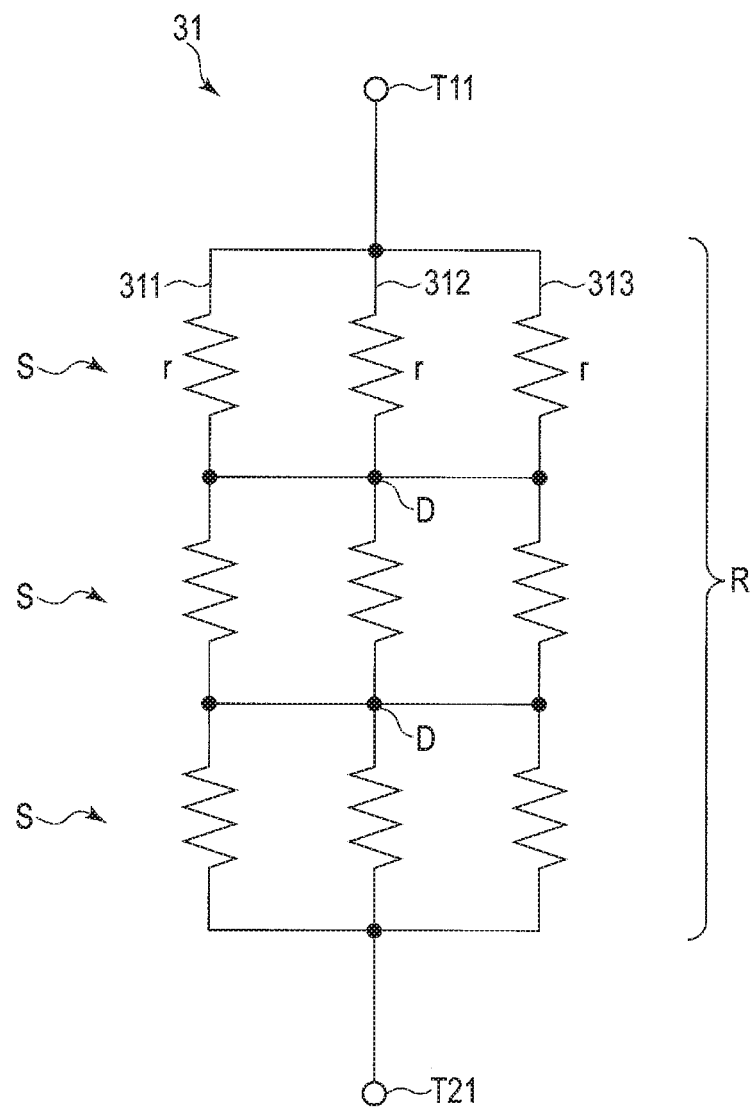
FIG. 8 is a diagram showing an equivalent circuit of the wire shown in FIG. 7.

FIG. 8 is a diagram showing an equivalent circuit of the wire 31 shown in FIG. 7. In the state where the wire portions 311, 312 and 313 are bundled together, the wire 31 as a whole has a resistance R. FIG. 8 shows how the wire 31 is divided along the direction Y. Points D of division are equivalent to the connection portions CN31, CN32, etc.

Let us suppose here that the wire 31 is divided for example by n along the direction Y and the wire portions 311, 312 and 313 in each divided segment S has a resistance of r. In a segment S, if, for example, any one of the wire portions 311, 312 and 313 is broken, the resistance of this segment S is r/2. Therefore, the entire resistance R' of when broken, $$R' = r/3 \cdot (n-1) + r/2$$
$$= 4/3 \cdot n + r/6$$
$$= R(1 + 1/(2n))$$

In the third embodiment as well, advantageous effects similar to those of the second embodiment can be obtained. Further, according to this embodiment, as described below, even if the wire 31 is partially broken, change in resistance of the entire wire 31 can be suppressed.

Figure 11:
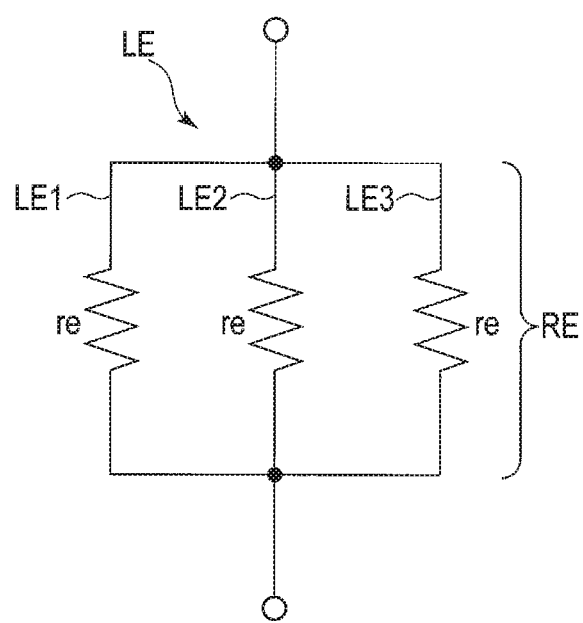
FIG. 11 is a diagram showing an equivalent circuit of the wire shown in FIG. 10.

FIG. 11 shows a diagram showing an equivalent circuit of a wire LE as a comparative example shown in FIG. 10. When the resistance of each of the wire portions LE1, LE2 and LE3 contained in the wire LE is defined as re, the resistance RE of the entire wire LE is re/3. Here, when, for example, one of the wire portions LE1, LE2 and LE3 is broken, the resistance of the entire wire LE is re/2, that is, the resistance increases to 1.5 times that of before broken.

On the other hand, according to this embodiment, as described with reference to FIG. 8, the wire 31 is divided into a plurality of segments S along the direction Y, that is, the extending direction of the wire 31, and therefore the entire resistance RE changes in units of divided resistance r. Therefore, even if, for example, any one of the wire portions 311, 312 and 313 is broken, the rise of resistance of the wire 31 can be suppressed as compared to the example shown in FIGS. 10 and 11. Especially, by increasing the number of divisions sufficiently, the rise of the entire resistance of the wire 31 can be significantly suppressed. Therefore, degradation of the signals supplied by the wire 31 can be suppressed, thereby improving the reliability of the display device DSP.

Here, increasing the number of divisions into the segments S is equivalent to, for example, increasing the number of connections portions contained in the wire. In other words, it is to shorten the distance between connection portions. Moreover, in the second and third embodiments, the number of wire portions which constitute one wire is set to two or three, but it is not limited to this. For example, one wire may comprise four or more wire portions. Further, the number of wire portions connected by one connection portion CN is not limited to two, but three or more wire portions may be connected by the connection portion CN.

Fourth Embodiment

Figure 9:
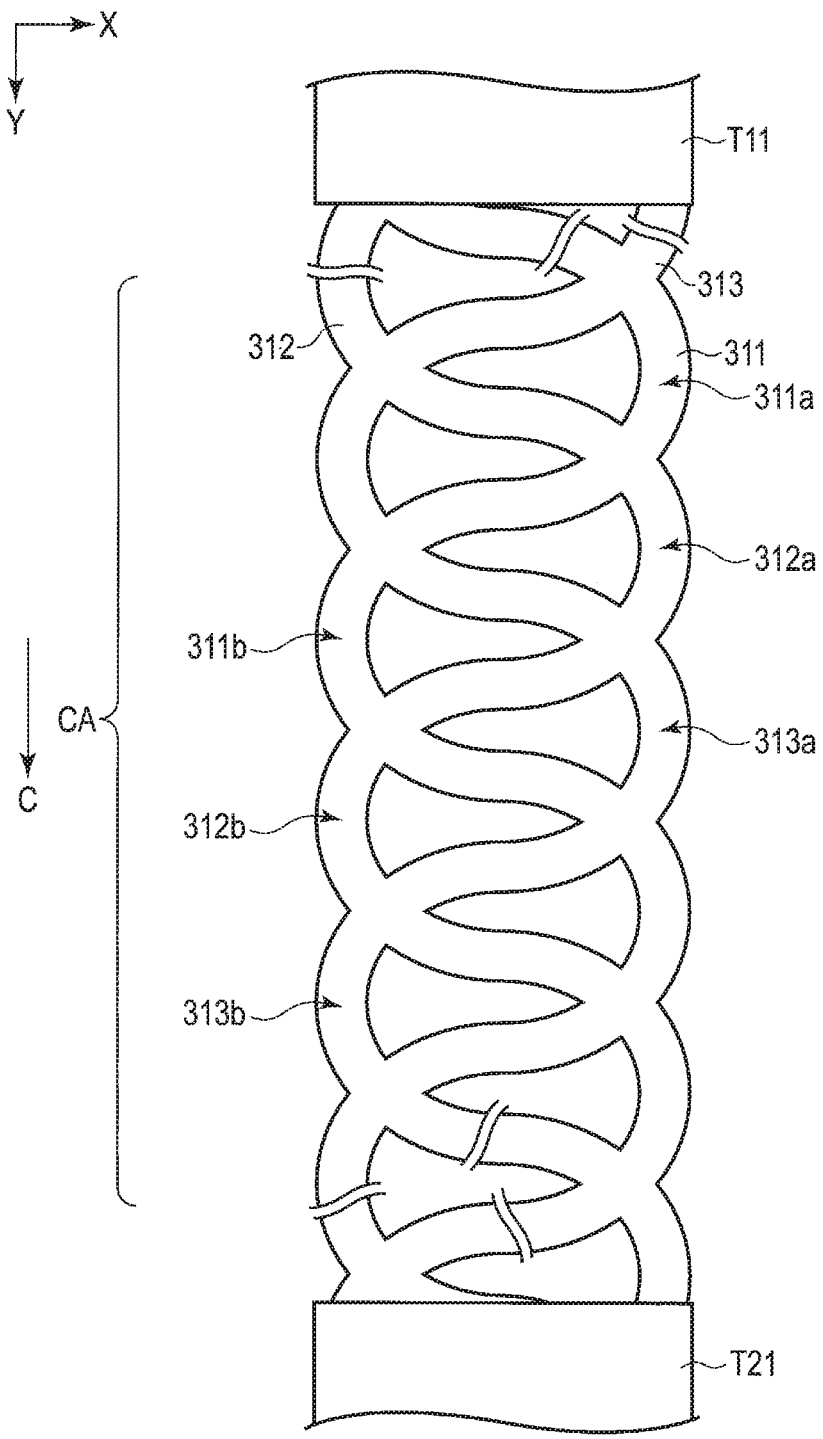
FIG. 9 is a diagram showing a wire 31 of a display device DSP according to a fourth embodiment.

FIG. 9 is a diagram showing a wire 31 of a display device DSP according to the fourth embodiment. The fourth embodiment is different from the third embodiment in that the bent portions are formed into a curvy shape. In the FIG. 9, the curvatures of bent portions 311a and 311b, the curvature of bent portions 312a and 312b and the curvature of bent portions 313a and 313b are equal to each other. Note that the curvature may vary from one bent portion to another.

In the fourth embodiment as well, advantageous effects similar to those of the third embodiment can be obtained. Further, according to this embodiment, with a curvy-shaped bent portion, concentration of the stress on a certain location can be suppressed. That is, the stress in each bent portion can be further equalized. Thus, breaking of the wire 31 can be inhibited, and thus a display device with improved reliability can be provided.

In the above-provided explanation, the wire 31 in the first embodiment is equivalent to the second wire, and the wire 32 in the first embodiment is equivalent to the third wire. In the second to fourth embodiments, the wire 31 is equivalent to the first wire. Common structural elements to the first to fourth embodiments will be hereinafter described.

FIG. 12 is a cross-sectional view of a plane area PA1 of the display device DSP shown in FIG. 1. The sub-substrate 101 comprises an insulating substrate 10, first to fifth insulating films 11 to 15, switching elements SW (SW1, SW2, SW3), a reflective layer RL, organic EL devices OLED (OLED1, OLED2, OLED3), a sealing layer 16, etc.

The insulating substrate 10 is formed from, for example, an organic insulating material such as polyimide. In the FIG. 12, a support member 71 is attached under the insulating substrate 10. The first insulating film 11 is formed on the insulating substrate 10. The first insulating film 11 may contain a barrier layer for inhibiting the entering of moisture or the like, heading from the insulating substrate 10 to the organic EL device OLED. Note that at least one of the support member 71 and the first insulating film 11 may be omitted.

The switching element SW is formed on the first insulating film 11. The switching element SW is formed from, for example, a thin film transistor (TFT). In the FIG. 12, the switching element SW is a top-gate type but may be in a bottom-gate type. The structure of the switching element will now be described with reference to an element SW1 as an example.

The switching element SW1 comprises a semiconductor layer SC, a gate electrode GE, a source electrode SE and a drain electrode DE.

The semiconductor layer SC is formed on the first insulating film 11, and is covered by the second insulating film 12. The gate electrode GE is formed on the second insulating film 12, and is covered by the third insulating film 13. The source and drain electrodes SE and DE are each formed on the third insulating layer 13. The source electrode SE and the drain electrode DE are each in contact with the semiconductor layer SC in a contact hole which penetrates the third insulating film 13 to the semiconductor layer SC.

Examples of the material which forms the gate electrode GE, the source electrode SE and the drain electrode DE are metal materials such as aluminum (Al), titanium (Ti), silver (Ag), molybdenum (Mo), tungsten (W), copper (Cu) and chromium (Cr), and an alloy of a combination of any of these metal materials. Moreover, each electrode may be of a single- or multi-layer structure. The electrodes may be formed of different materials or may have different layer structures from one to another. The first to third insulating films 11 to 13 are each formed from, for example, an inorganic insulating material such as silicon oxide, silicon nitride or silicon oxynitride. The switching element SW1 is covered by a fourth insulating film 14. The fourth insulating film 14 is formed of an organic insulating material.

The organic EL devices OLED are formed on the fourth insulating film 14. In the FIG. 12, the organic EL devices OLED are of the so-called top emission type, which emits light to a side opposite to the insulating substrate 10, but they are not limited to this example. They may be of the so-called bottom emission type, which emits light to a side of the insulating substrate 10. For example, the organic EL device OLED1 comprises an organic emitting layer ORG1 which emits red light, the organic EL device OLED2 comprises an organic emitting layer ORG2 which emits blue light, and the organic EL device OLED3 comprises an organic emitting layer ORG3 which emits green light. The structure thereof will now be described with reference to the organic EL device OLED1 as an example.

The organic EL device OLED1 comprises a pixel electrode PE1, a common electrode CE and an organic emitting layer ORG1.

A pixel electrode PE1 is provided on the fourth insulating film 14. The pixel electrode PE1 functions as, for example, a positive electrode of the organic EL device OLED1. To the pixel electrode PE1, a power source potential (anode power source potential PVDD) is supplied via an anode power source wire. The pixel electrode PE1 is in contact with the drain electrode DE of the switching element SW1 in the contact hole made in the fourth insulating film 14, so as to be electrically connected to the switching element SW1. The organic emitting layer ORG1 is formed on the pixel electrode PE1. The organic emitting layer ORG1 may further include an electron injection layer, a hole injection layer, an electron transport layer, an hole transport layer and the like, in order to improve emission efficiency. The common electrode CE is formed on the organic emitting layer ORG1. The common electrode CE functions as, for example, a negative electrode of the organic EL device OLED1. To the common electrode CE, a power source potential (cathode power source potential PVSS) is supplied via a cathode power source wire. The common electrode CE and the pixel electrodes PE1 are formed from, for example, a transparent conductive material such as indium-tin-oxide (ITO) or indium-zinc-oxide (IZO). The organic EL device OLED1 emits light at the brightness according to voltage (or current) applied between the pixel electrode PE1 and the common electrode CE.

In the case of the top emission type, the organic EL device OLED1 should preferably include, as shown in FIG. 12, a reflective layer RL between the fourth insulating film 14 and the pixel electrode PE1. The reflective layer RL is formed from, for example, a highly reflective metal material such as aluminum or silver. The reflection surface of the reflective layer RL, i.e., the surface on the side of the organic emitting layer ORG1, may be flat as illustrated, or irregular with recesses and projections to impart light-scatterability.

The organic EL devices OLED are formed by partition into each pixel PX by a fifth insulating film (rib) 15 formed of an organic insulating material. That is, the organic emitting layer ORG1, ORG2 and ORG3 are located between the fifth insulating film 15 and the fifth insulating film 15. In the FIG. 12, the common electrode CE is in contact with the organic emitting layers ORG1, ORG2 and ORG3, and also with the fifth insulating film 15.

Note that the display device DSP may comprise a common organic emitting layer over a plurality of pixels PX. With such a structure, the display device DSP comprises color filters at locations opposing the organic EL devices OLED, respectively. The color filters are formed from, for example, resin materials colored in red, green, blue or the like.

The sealing layer 16 covers the organic EL devices OLED. The sealing layer 16 inhibits the entering of moisture or oxygen to the organic EL devices OLED, thereby suppressing degradation of the organic EL devices OLED. The sealing layer 16 comprises a first inorganic film 161, an organic layer 162 and a second inorganic film 163.

The first inorganic film 161 is formed on the organic EL devices OLED. In the FIG. 12, the first inorganic film 161 is in contact with the common electrode CE. The second inorganic film 163 is located above the first inorganic film 161. The organic layer 162 is located between the first inorganic film 161 and the second inorganic film 163 and is in contact with these films.

The first inorganic film 161 and the second inorganic film 163 comprises a function which blocks the entering of moisture to a side of the organic EL devices OLED. The first inorganic film 161 and the second inorganic film 163 are transparent and formed of, for example, silicon nitride. The organic layer 162 is formed from a transparent organic material. Note that the definition of the term "transparent" here covers such a case where transmitted light is colored in a range that display is not influenced.

FIG. 13 is a cross section showing a plane area PA1, a curved surface area CA and a plane area PA2. This diagram schematically shows a state before the curved surface area CA is bent. The plane area PA1, curved surface area CA and plane area PA2 are arranged along the direction Y in this order.

In addition to the support member 71, insulating substrate 10, first to fifth insulating films 11 to 15, reflective layer RL, organic EL devices OLED and sealing layer 16, the display device DSP further comprises a support member 72, terminals T11 and T12, a wire 31 and a protective film 8.

The insulating substrate 10 is located over the plane area PA1, curved surface area CA and plane area PA2. The support member 71 is attached on a lower surface of the insulating substrate 10 in the plane area PA1. The support member 72 is attached on the lower surface of the insulating substrate 10 in the plane area PA2. The curved surface area CA is equivalent to a region where the support members 71 and 72 are not formed.

In the plane area PA2, the first to third insulating films 11 to 13 are stacked one on another in this order. On the other hand, in the curved surface area CA, the first to third insulating films 11 to 13 are not formed.

The wire 31 is formed over the plane area PA1, curved surface area CA and plane area PA2. In the plane area PA1, the wire 31 is located between the third insulating film 13 and the fourth insulating film 14. In the FIG. 13, the wire 31 is in contact with the second insulating film 12 and the first insulating film 11 as well in the plane area PA1. In the curved surface area CA, the wire 31 is formed on the insulating substrate 10. In the plane area PA2, the wire 31 is formed on the third insulating film 13. In the FIG. 13, the wire 31 is in contact with the second insulating film 12 and the first insulating film 11 as well in the plane area PA2.

The terminal T11 is formed on the fourth insulating film 14 in the plane area PA1. The terminal T11 is in contact with the wire 31 in the contact hole CH which penetrates the fourth insulating film 14. The common electrode CE extended to a side of the curved surface area CA with respect to the respective organic EL device OLED, and is in contact with the terminal T11. Thus, the organic EL device OLED and the wire L are electrically connected to each other. The terminal T12 is formed on the wire 31 in the plane area PA2.

As described above, the first to third insulating films 11 to 13 formed of inorganic insulating materials are removed in the curved surface area CA; therefore, the wire 31 is in contact with the insulating substrate 10. Thus, the inorganic insulating films with higher rigidity than that of the organic insulating films are removed, and therefore cracking of the inorganic insulating films, which may occur when the curved surface area CA is bent, can be prevented. Therefore, the breaking of the wire 31 can be suppressed.

Furthermore, in the curved surface area CA, the wire 31 is covered by the protective film 8 which is made from an organic insulating material. The protective film 8 is formed by hardening an organic material by irradiation of ultraviolet rays. With the protective film 8 with such a structure, the position of the neutral surface of the stress caused when bending the curved surface area CA can be set near the wire 31 along the direction Z. Therefore, the load on the wire 31 in the curved surface area CA can be lightened.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A display device comprising:
   a substrate;
   a display element provided on the substrate;
   a driver provided on the substrate configured to drive the display element; and
   a plurality of wires each electrically connecting the display element to the driver and the wires comprising:
      a second wire comprising a fourth bent portion provided in a sixth location; and
      a third wire being adjacent to the second wire in a first direction and comprising a fifth bent portion provided in a seventh location different from the sixth location in a second direction crossing the first direction.

2. The display device of claim 1,
   wherein the fourth bent portion comprises a third apex in the sixth location, and
   wherein the fifth bent portion comprises a fourth apex in the seventh location.

3. The display device of claim 1,
   wherein the substrate comprises
      a first sub-substrate comprises a curved surface area, and
      a second sub-substrate connected to the first sub-substrate, and
   wherein the display element and the driver are provided on the first sub-substrate.

4. The display device of claim 1,
   wherein the substrate comprising
      a first sub-substrate and
      a second sub-substrate connected to the first sub-substrate and comprising a curved surface area,
   wherein the display element is provided on the first sub-substrate, and
   wherein the driver is provided on the second sub-substrate.

5. The display device of claim 1,
   wherein different signals are supplied to the second wire and the third wire, respectively.

* * * * *